(12) United States Patent
Kadoguchi et al.

(10) Patent No.: US 10,103,090 B2
(45) Date of Patent: Oct. 16, 2018

(54) SEMICONDUCTOR DEVICE

(71) Applicants: TOYOTA JIDOSHA KABUSHIKI KAISHA, Toyota-shi, Aichi (JP); DENSO CORPORATION, Kariya-shi, Aichi (JP)

(72) Inventors: Takuya Kadoguchi, Toyota (JP); Takahiro Hirano, Toyota (JP); Takanori Kawashima, Anjo (JP); Keita Fukutani, Kariya (JP); Tomomi Okumura, Kariya (JP); Masayoshi Nishihata, Kariya (JP)

(73) Assignees: Toyota Jidosha Kabushiki Kaisha, Toyota-shi, Aichi (JP); Denso Corporation, Kariya-shi, Aichi (JP)

( * ) Notice: Subject to any disclaimer, the term of this patent is extended or adjusted under 35 U.S.C. 154(b) by 0 days.

(21) Appl. No.: 15/123,794

(22) PCT Filed: Jan. 15, 2015

(86) PCT No.: PCT/JP2015/050894
§ 371 (c)(1),
(2) Date: Sep. 6, 2016

(87) PCT Pub. No.: WO2015/136968
PCT Pub. Date: Sep. 17, 2015

(65) Prior Publication Data
US 2017/0018484 A1 Jan. 19, 2017

(30) Foreign Application Priority Data
Mar. 10, 2014 (JP) .................................. 2014-046595

(51) Int. Cl.
*H01L 23/495* (2006.01)
*H01L 23/433* (2006.01)
(Continued)

(52) U.S. Cl.
CPC .... *H01L 23/49513* (2013.01); *H01L 21/4825* (2013.01); *H01L 21/4882* (2013.01);
(Continued)

(58) Field of Classification Search
CPC ................. H01L 24/40; H01L 23/4334; H01L 23/49537; H01L 2224/40245;
(Continued)

(56) References Cited

U.S. PATENT DOCUMENTS

2005/0093131 A1* 5/2005 Nakase .................... H01L 23/42
257/693
2014/0035112 A1* 2/2014 Kadoguchi ....... H01L 23/49548
257/666
2014/0264819 A1* 9/2014 Okumura ............ H01L 23/3672
257/712

FOREIGN PATENT DOCUMENTS

CN 100343987 C 10/2007
CN 103493197 A 1/2014
(Continued)

*Primary Examiner* — Marc Armand
*Assistant Examiner* — Sue Tang
(74) *Attorney, Agent, or Firm* — Finnegan, Henderson, Farabow, Garrett & Dunner, LLP

(57) ABSTRACT

The semiconductor device includes a semiconductor element, and an electro-conductive first plate-like part electrically connected to a top-face-side electrode of the semiconductor element and including a first joint part projecting from a side face, and an electro-conductive second plate-like part including a second joint part projecting from a side face. A bottom face of the first joint part and a top face of the second joint part face one another, and are electrically connected via an electro-conductive bonding material. A bonding-material-thickness ensuring means is provided in a zone where the bottom face of the first joint part and the top face of the second joint part face one another to ensure a thickness of the electro-conductive bonding material
(Continued)

between an upper portion of a front end of the second joint part and the bottom face of the first joint part.

12 Claims, 9 Drawing Sheets

(51) Int. Cl.
 *H01L 21/48* (2006.01)
 *H01L 21/56* (2006.01)
 *H01L 23/31* (2006.01)
 *H01L 23/00* (2006.01)

(52) U.S. Cl.
 CPC ........ *H01L 21/565* (2013.01); *H01L 23/3142* (2013.01); *H01L 23/4334* (2013.01); *H01L 23/49537* (2013.01); *H01L 23/49551* (2013.01); *H01L 23/49562* (2013.01); *H01L 23/49568* (2013.01); *H01L 23/49575* (2013.01); *H01L 24/40* (2013.01); *H01L 23/3121* (2013.01); *H01L 24/29* (2013.01); *H01L 24/32* (2013.01); *H01L 24/33* (2013.01); *H01L 24/45* (2013.01); *H01L 24/48* (2013.01); *H01L 24/73* (2013.01); *H01L 24/92* (2013.01); *H01L 2224/29111* (2013.01); *H01L 2224/32245* (2013.01); *H01L 2224/33181* (2013.01); *H01L 2224/40245* (2013.01); *H01L 2224/45144* (2013.01); *H01L 2224/45147* (2013.01); *H01L 2224/48247* (2013.01); *H01L 2224/73215* (2013.01); *H01L 2224/73265* (2013.01); *H01L 2224/83801* (2013.01); *H01L 2224/92165* (2013.01); *H01L 2924/00014* (2013.01); *H01L 2924/1203* (2013.01); *H01L 2924/13055* (2013.01); *H01L 2924/181* (2013.01)

(58) Field of Classification Search
 CPC ..... H01L 2924/181; H01L 2224/73265; H01L 2224/73215; H01L 23/3121; H01L 2224/45147; H01L 2224/45144; H01L 2224/33181; H01L 2224/32245
 See application file for complete search history.

(56) References Cited

FOREIGN PATENT DOCUMENTS

| | | |
|---|---|---|
| JP | 2005-136018 | 5/2005 |
| JP | 2008-166626 A | 7/2008 |
| JP | 4403665 | 11/2009 |
| JP | 2012-235081 | 11/2012 |
| JP | 2013-16623 | 1/2013 |
| JP | 2013-016623 A | 1/2013 |
| JP | 2013-149684 A | 8/2013 |
| JP | 5488541 | 3/2014 |
| JP | 2014-154736 | 8/2014 |
| JP | 2014-179443 | 9/2014 |
| JP | 5947537 | 6/2016 |

\* cited by examiner

SEMICONDUCTOR DEVICE

TECHNICAL FIELD

The present invention relates to a semiconductor device.

BACKGROUND ART

Recently, a semiconductor device in which metal plates are electrically and thermally connected to top and bottom faces of a plurality of semiconductor elements, and the semiconductor elements are sealed with a resin, is known (for example, see Patent Reference No. 1). As one example of such a semiconductor device, a semiconductor device in which semiconductor elements such as insulated gate bipolar transistors (IGBTs), diodes, and so forth, are arranged longitudinally and laterally may be cited.

An IGBT is such that the base of a bipolar transistor is replaced with the gate of a field effect transistor (FET), and has high speed performance and power durability of a bipolar transistor that is driven by a current, and also, power saving performance of a field effect transistor that is driven by a voltage. Therefore, such a semiconductor device can be used as a power semiconductor device that carries out switching operations.

PRIOR ART REFERENCE

Patent Reference

Patent Reference No. 1: Japanese Laid-Open Patent Application No. 2012-235081

SUMMARY OF THE INVENTION

Problem to be Solved by the Invention

However, in such a semiconductor device, metal plates may be joined together with a bonding material (such as solder). In such a case, if one metal plate is inclined with respect to the other metal plate, connection reliability may be degraded because an end of the metal plate comes into contact with a surface of the other metal plate, and, near the contact position, a thickness of a bonding material cannot be ensured.

The present invention has been devised in consideration of the above-mentioned point, and an object of the present invention is to provide a semiconductor device in which even if one of connected parts connected via a bonding material is inclined, connection reliability can be ensured.

Means to Solve the Problem

The present semiconductor device includes a semiconductor element; a first plate-like part that is made of an electric conductor, is electrically connected to an top-face-side electrode of the semiconductor element, and includes a first joint part that projects from a side face of the first plate-like part; and a second plate-like part that is made of an electric conductor, and includes a second joint part that projects from a side face of the second plate-like part. A bottom face of the first joint part and a top face of the second joint part face one another, and are electrically connected via an electro-conductive bonding material. A bonding-material-thickness ensuring means is provided in a zone where the bottom face of the first joint part and the top face of the second joint part face one another to ensure a thickness of the electro-conductive bonding material between an upper portion of a front end of the second joint part and the bottom face of the first joint part.

Advantageous Effects of the Invention

According to the disclosed technology, it is possible to provide a semiconductor device in which, even if one of connected parts connected via a bonding material is inclined, connection reliability can be ensured.

MODE FOR CARRYING OUT THE INVENTION

Figure 1:
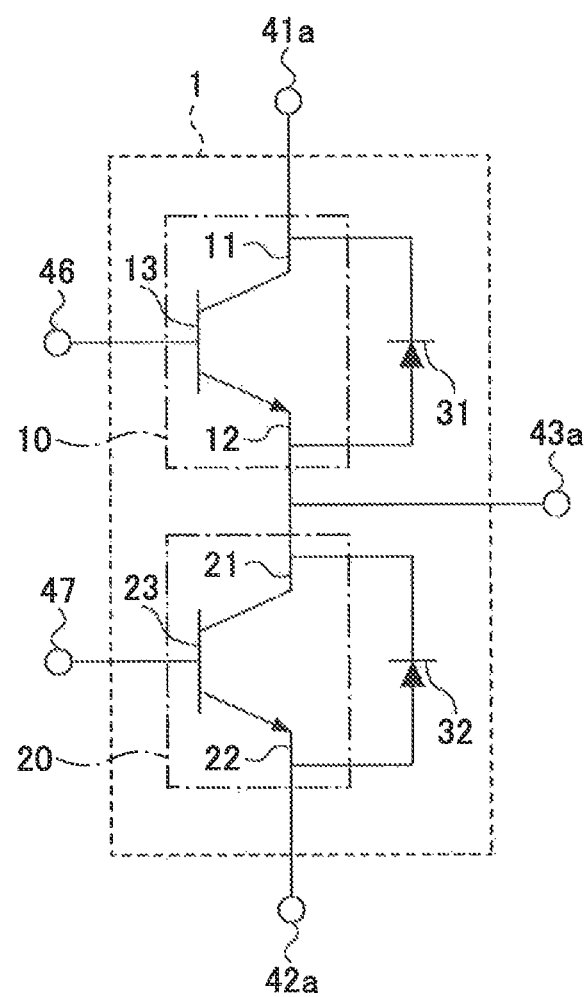
FIG. 1 illustrates a circuit configuration of a semiconductor device according to a first embodiment.

Below, with reference to the drawings, modes for carrying out the invention will be described. For each embodiment, a semiconductor device in which four semiconductor elements (two IGBTs and two diodes) are arranged longitudinally and laterally will be described, as an example. However, an embodiment is not limited thereto. Note that, in each drawing, the same reference numerals are given to the same elements, and the duplicate description may be omitted.

<First Embodiment>

First, a circuit configuration of a semiconductor device according to a first embodiment will be described. FIG. 1 illustrates a circuit configuration of the semiconductor device according to the first embodiment. With reference to FIG. 1, the semiconductor device 1 according to the first embodiment is an inverter circuit that has IGBTs 10 and 20, and diodes 31 and 32.

In the semiconductor device 1, the IGBT 10 includes a collector electrode 11, an emitter electrode 12, and a gate electrode 13. The IGBT 20 includes a collector electrode 21, an emitter electrode 22, and a gate electrode 23.

The collector electrode 11 of the IGBT 10 is electrically connected with the cathode of the diode 31 and a high-potential-side power supply terminal 41a. The emitter electrode 12 of the IGBT 10 is electrically connected with the anode of the diode 31. In other words, the diode 31 is connected in reverse parallel with the IGBT 10. The gate electrode 13 of the IGBT 10 is electrically connected with at least one of control electrode terminals 46.

The emitter electrode 22 of the IGBT 20 is electrically connected with the anode of the diode 32 and a low-potential-side power supply terminal 42a. The collector electrode 21 of the IGBT 20 is electrically connected with the cathode of the diode 32. In other words, the diode 32 is connected in reverse parallel with the IGBT 20. The gate electrode 13 of the IGBT 20 is electrically connected with at least one of control electrode terminals 47.

The emitter electrode 12 of the IGBT 10 is electrically connected also with the collector electrode 21 of the IGBT 20, and also, is electrically connected with an output terminal 43a. Note that, because higher voltages are applied to the high-potential-side power supply terminal 41a, the low-potential-side power supply terminal 42a, and the output terminal 43a than those applied to the control electrode terminals 46 and 47, these three terminals may be referred to as high-voltage terminals.

Figure 2:
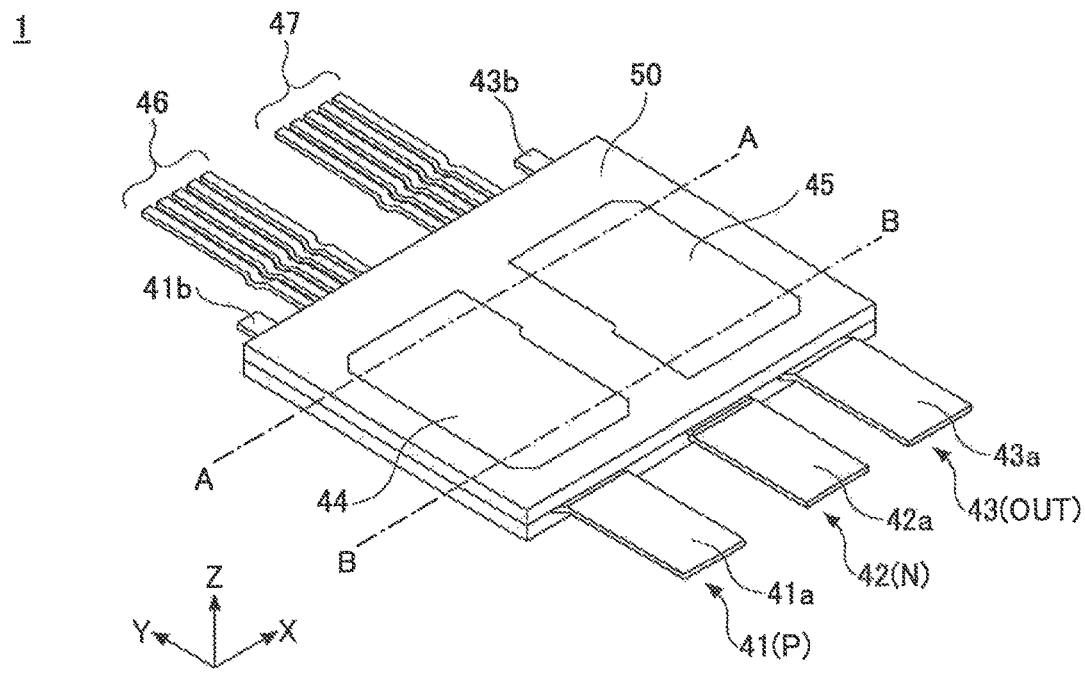
FIG. 2 shows a perspective view illustrating the semiconductor device according to the first embodiment.
Figure 3:
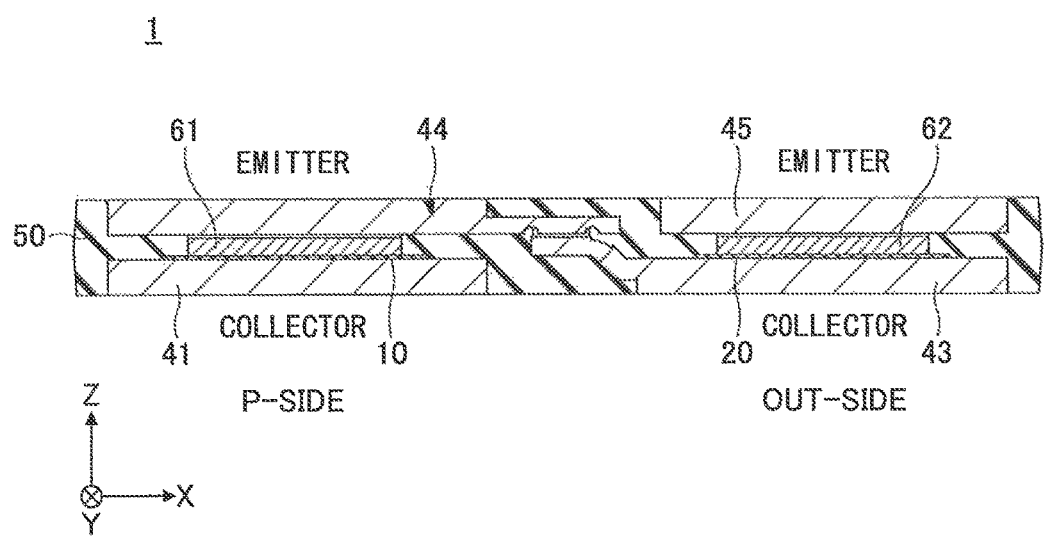
FIG. 3 shows a sectional view of the semiconductor device according to the first embodiment taken along an A-A line of FIG. 2.
Figure 4:
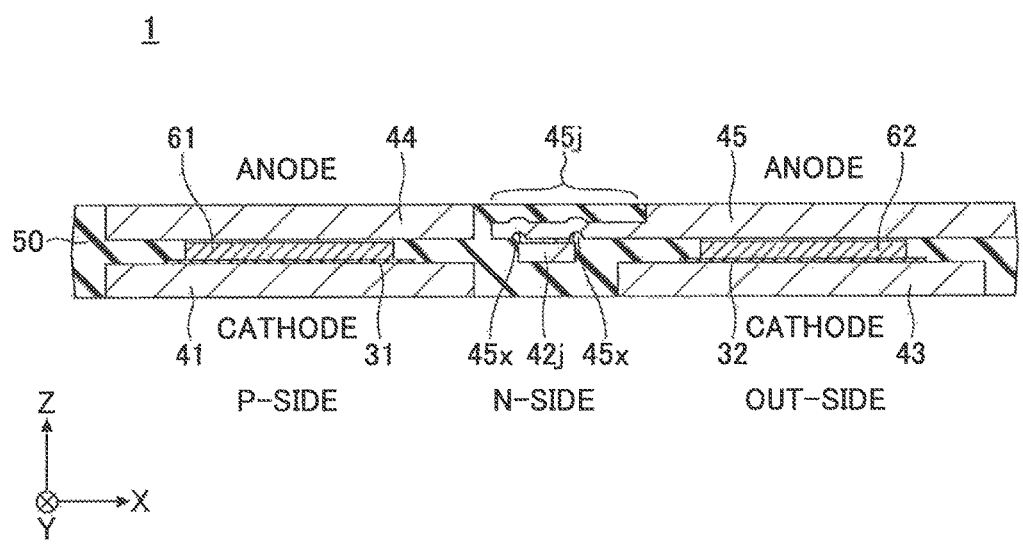
FIG. 4 shows a sectional view of the semiconductor device according to the first embodiment taken along a B-B line of FIG. 2.
Figure 5:
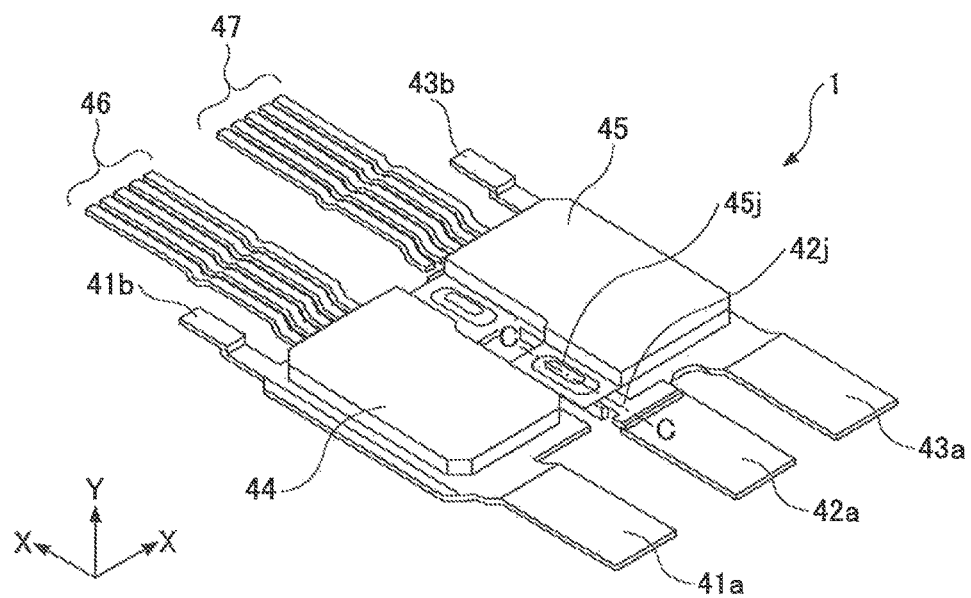
FIG. 5 shows a perspective view illustrating an internal configuration of the semiconductor device according to the first embodiment.
Figure 6:
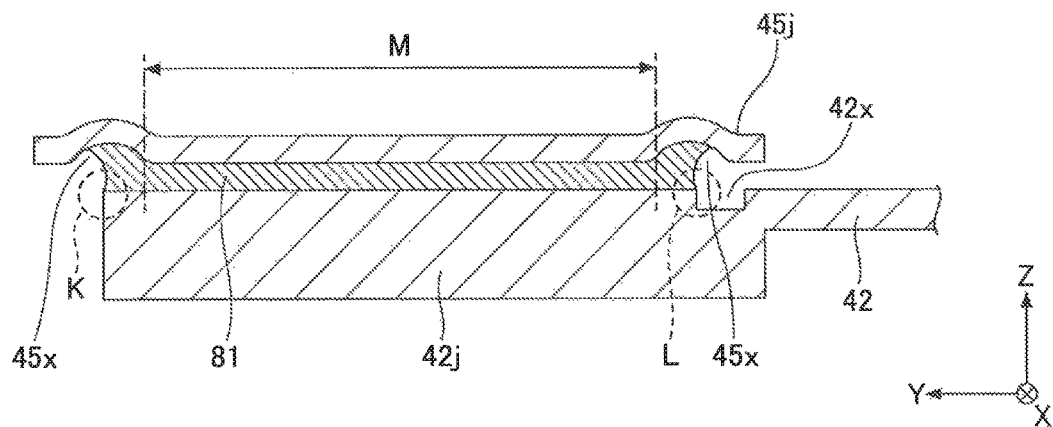
FIG. 6 shows a sectional view of the semiconductor device according to the first embodiment taken along a C-C line of FIG. 5.
Figure 7:
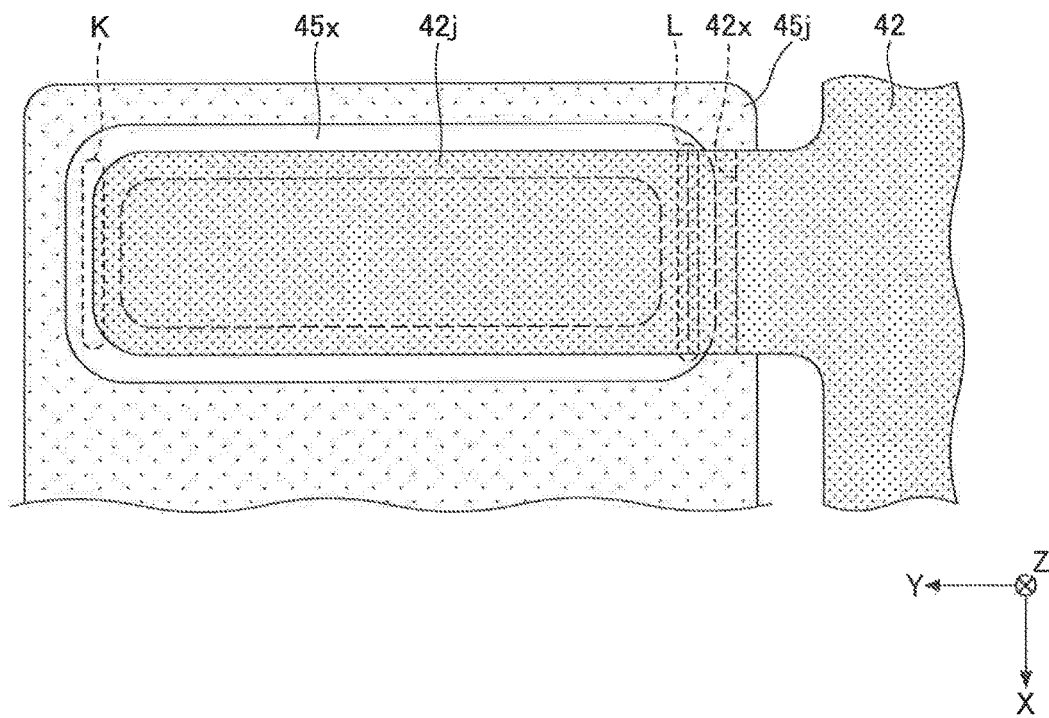
FIG. 7 shows a partial bottom view corresponding to FIG. 6 illustrating the semiconductor device according to the first embodiment.

Next, a structure of the semiconductor device according to the first embodiment will be described. FIG. 2 shows a perspective view illustrating the semiconductor device according to the first embodiment. FIG. 3 shows a sectional view of the semiconductor device according to the first embodiment taken along an A-A line of FIG. 2. FIG. 4 shows a sectional view of the semiconductor device according to the first embodiment taken along a B-B line of FIG. 2. FIG. 5 shows a perspective view illustrating an internal structure of the semiconductor device according to the first embodiment. FIG. 6 shows a sectional view of the semiconductor device according to the first embodiment taken along a C-C line of FIG. 5. FIG. 7 shows a partial bottom view corresponding to FIG. 6 illustrating the semiconductor device according to the first embodiment.

Note that, in the present application, concerning the semiconductor device 1, faces where metal plates 44 and 45 are exposed are referred to as top faces, and faces where metal plates 41 and 43 are exposed are referred to as bottom faces. Also, faces from which the high-potential-side power supply terminal 41a, the low-potential-side power supply terminal 42a, and the output terminal 43a project are referred to as front faces. Also, faces from which hanging lead terminal 41b, hanging lead terminal 43b, control electrode terminals 46, and the control electrode terminals 47 project are referred to as rear faces. Also, the other faces are referred to as side faces.

With reference to FIGS. 2-7, in the semiconductor device 1, the metal plate 41 that includes the high-potential-side power supply terminal 41a and the hanging lead terminal 41b, the metal plate 42 that includes the low-potential-side power supply terminal 42a, and the metal plate 43 that includes the output terminal 43a and the hanging lead terminal 43b are installed in parallel at predetermined intervals in such a manner that the longitudinal directions thereof are approximately the same direction (Y-direction).

Also, the control electrode terminals 46 are a plurality of metal lead terminals installed in parallel at predetermined intervals to have longitudinal directions that are approximately the same direction (the Y-direction) as the longitudinal direction of the metal plates 41. Also, the control electrode terminals 47 are a plurality of metal lead terminals installed in parallel at predetermined intervals to have longitudinal directions that are approximately the same direction (the Y-direction) as the longitudinal direction of the metal plates 43.

Each of the materials of the metal plates 41, 42, and 43, and the control electrode terminals 46 and 47 may be, for example, copper (Cu), nickel (Ni), aluminum (Al), or the like. Each of the surfaces of the metal plates 41, 42, and 43, and the control electrode terminals 46 and 47 may be plated with silver (Ag), gold (Au), or the like.

The IGBT 10 is mounted on the top face of the metal plate 41 in such a manner that the collector electrode 11 is electrically connected with the metal plate 41 through an electro-conductive bonding material such as tin-based solder (not shown). Note that because the collector electrode 11 is a p-type electrode, the metal plate 41 connected with the collector electrode 11 may be referred to as a P-side. Also, the diode 31 is mounted on the top face of the metal plate 41 in such a manner that the cathode is electrically connected with the metal plate 41 through an electro-conductive bonding material such as tin-based solder (not shown). The IGBT 10 and the diode 31 are arranged in the longitudinal direction (Y-direction) of the metal plate 41.

The IGBT 20 is mounted on the top face of the metal plate 43 in such a manner that the collector electrode 21 is electrically connected with the metal plate 43 through an electro-conductive bonding material such as tin-based solder (not shown). Also, the diode 32 is mounted on the top face of the metal plate 43 in such a manner that the cathode is electrically connected with the metal plate 43 through an electro-conductive bonding material such as tin-based solder (not shown). The IGBT 20 and the diode 32 are arranged in the longitudinal direction (Y-direction) of the metal plate 43.

The thickness of the metal plate 41 where the IGBT 10 and the diode 31 are mounted (i.e., the thickness of the portion of the metal plate 41 other than the high-potential-side power supply terminal 41a and the hanging lead terminal 41b) may be, for example, around 2 through 3 millimeters. The thickness of the metal plate 43 where the IGBT 20 and the diode 32 are mounted (i.e., the thickness of the portion the metal plate 43 other than the output terminal 43a and the hanging lead terminal 43b) may be, for example, around 2 through 3 millimeters. The thickness of the metal plate 41 where the IGBT 10 and the diode 31 are mounted may be approximately the same as the thickness of the metal plate 43 where the IGBT 20 and the diode 32 are mounted.

The thickness of the high-potential-side power supply terminal 41a and the hanging lead terminal 41b of the metal plate 41 may be less than the portion of the metal plate 41 where the IGBT 10 and the diode 31 are mounted, and, for example, may be on the order of 0.5 mm. The thickness of the output terminal 43a and the hanging lead terminal 43b of the metal plate 43 may be less than the portion of the metal plate 43 where the IGBT 20 and the diode 32 are mounted, and, for example, may be on the order of 0.5 mm.

On the IGBT 10 and the diode 31, the metal plate 44 is placed in such a manner as to be electrically connected to the emitter electrode 12 of the IGBT 10 and the anode of the diode 31 via an electro-conductive spacer 61 (for example, a metal block made of a copper, or the like) and an electro-conductive bonding material such as tin-based solder. In other words, the electro-conductive spacer 61 (for example, a metal block made of a copper, or the like) is placed between the bottom face of the metal plate 44 and the top-face-side electrodes of the IGBT 10 and the diode 31. The metal plate 44 is electrically connected with the metal plate 43 via an electro-conductive bonding material (not shown) of tin-based solder or the like.

On the IGBT 20 and the diode 32, the metal plate 45 is placed in such a manner as to be electrically connected to the emitter electrode 22 of the IGBT 20 and the anode of the diode 32 via an electro-conductive spacer 62 (for example, a metal block made of a copper, or the like) and an electro-conductive bonding material such as tin-based solder. In other words, the electro-conductive spacer 62 (for example, a metal block made of a copper, or the like) is placed between the bottom face of the metal plate 45 and the top-face-side electrodes of the IGBT 20 and the diode 32.

The metal plate 45 has a joint part 45j at a side face projecting toward the metal plate 44. The metal plate 42 has a joint part 42j at a side face projecting toward the control electrode terminals 46 and 47. The thickness of each of the joint parts 42j and 45j can be, for example, on the order of 0.5 mm.

The bottom face of the joint part 45j of the metal plate 45 and the top face of the joint part 42j of the metal plate 42 face one another, and are electrically connected via an electro-conductive bonding material 81 (for example, tin-based solder, or the like). Note that, because the emitter electrode 22 is an n-type electrode, the metal plate 42 connected to the emitter electrode 22 may be referred to as an n-side.

At a peripheral portion on the bottom face of the joint part 45j, a ring-shaped groove 45x is formed to absorb a superfluous bonding material 81. Also on the top face of the joint part 42j, a groove 42x is formed to absorb a superfluous bonding material 81. The width of the groove 45x can be, for example, on the order of 400 through 600 μm. The depth of the groove 45x can be, for example, on the order of 200 through 300 μm.

In FIG. 6 and so forth, the sectional shape of the groove 45x is semicircular. However, the sectional shape of the groove 45x can be different from a semicircular shape. For example, the sectional shape of the groove 45x may be semiellipse, rectangular, or the like. Further, as long as it is possible to ensure a sufficient volume to absorb a superfluous bonding material 81, the groove 45x may have a shape different from a ring shape. Note that, the groove 45x is a typical example of a "groove" according to the present invention.

An upper portion of the front end K of the joint part 42j (i.e., a portion near the joint part 45j of an end of the joint part 42j near the control electrode terminals 46 and 47) is fixed to a position overlapping with the groove 45x in plan view (in a state where the upper portion of the front end K of the joint part 42j falls into a position corresponding to the groove 45x) via the bonding material 81. Note that, M (an area inside the groove 45x) denotes an area where the joint part 45j and the joint part 42j are to be joined (i.e., where the bonding material 81 is to be placed) (hereinafter, referred to as a joint area M).

As a result of the groove 42x being formed, the top face of the joint part 42j has a shape of a projection. Therefore, the upper portion of the front end K of the joint part 42j can be said to be the upper portion of the front end K of the projection. Also the upper portion of the rear end L of the projection (a portion near the joint part 45j of an end of the projection near the groove 42x) is fixed via the bonding material 81 to a position overlapping with the groove 45x in plan view.

In FIG. 7, also portions other than the upper portion of the front end K (the upper portion of the front end K of the joint part 42j) and the upper portion of the rear end L of the projection are fixed to positions overlapping with the groove 45x in plan view. However, the other portions than the upper portion of the front end K and the upper portion of the rear end L of the projection need not be fixed at positions overlapping with the groove 45x in plan view.

Although corresponding enlarged views are omitted, also the metal plates 43 and 44 have joint parts similar to those of the metal plates 42 and 45. The bottom face of the joint part of the metal plate 44 is electrically connected to the top face of the joint part of the metal plate 43 via an electro-conductive bonding material (for example, tin-based solder, of the like). By forming the structures of the joint part of the metal plate 43 and the joint part of the metal plate 44 to be similar to those of the joint part 42j and the joint part 45j, similar advantageous effects (i.e., an improvement in connection reliability between the joint part 42j and the joint part 45j, as will be described later) can be acquired. However, the metal plates 43 and 44 have such structures that the metal plates 43 and 44 are not likely to be inclined in comparison to the metal plate 42.

The thickness of the metal plate 44 can be, for example, on the order of 2 through 3 mm. The thickness of the metal plate 45 can be, for example, on the order of 2 through 3 mm. The metal plate 44 and the metal plate 45 may have approximately the same thicknesses. The materials of the metal plates 44 and 45 may be, for example, copper (Cu), nickel (Ni), aluminum (Al), or the like. The surfaces of the metal plates 44 and 45 may be plated with silver (Ag), gold (Au), or the like.

Note that the metal plate 45 is a typical example of a first plate-like part according to the present invention, and the joint part 45j is a typical example of a first joint part according to the present invention. Also, the metal plate 42 is a typical example of a second plate-like part according to the present invention, and the joint part 42j is a typical example of a second joint part according to the present invention.

The respective metal lead terminals of the control electrode terminals 46 are electrically connected to the gate electrode 13 of the IGBT 10, a temperature sensor (not shown), and so forth, via bonding wires. The respective metal lead terminals of the control electrode terminals 47 are electrically connected to the gate electrode 23 of the IGBT 20, a temperature sensor (not shown), and so forth, via bonding wires. Each of the metal lead terminals of the control electrode terminals 46 and 47 can have a thickness of, for example, on the order of 0.5 mm. As the bonding wires, for example, metal wires such as gold wires or copper wires.

The IGBTs 10 and 20, the diodes 31 and 32, the metal plates 41 through 45, the control electrode terminals 46 and 47, and the bonding wires are sealed with a sealing resin 50.

However, the bottom faces of the metal plates 41 and 43 are at least partially exposed from the bottom face of the sealing resin 50. Also, the top faces of the metal plates 44 and 45 are at least partially exposed from the top face of the sealing resin 50.

Also, each of the high-potential-side power supply terminal 41*a* of the metal plate 41, the low-potential-side power supply terminal 42*a* of the metal plate 42, and the output terminal 43*a* of the metal plate 43 at least partially projects from the front face of the sealing resin 50. Also, each of the hanging lead terminal 41*b* formed on the end of the metal plate 41, the hanging lead terminal 43*b* formed on the end of the metal plate 43, the control electrode terminals 46, and the control electrode terminals 47 at least partially projects from the rear face of the sealing resin 50.

A first direction (approximately, the X-direction) in which the IGBT 10 and the IGBT 20 are arranged is perpendicular to a second direction (approximately, the Y-direction) in which the hanging lead terminals 41*b* and 43*b* and the control electrode terminals 46 and 47 project. However, "perpendicular" in the present application is not "perpendicular" in its strict meaning, but means "approximately perpendicular". For example, even if the angle between the first direction and the second direction is different from 90 degrees by ten and several degrees due to a variation occurring in manufacturing, or the like, the angle is included in "perpendicular" angles.

The sealing resin 50 can be made of, for example, an epoxy resin including a filler, or the like. The sealing resin 50 can have a thickness of, for example, on the order of 5 mm.

The portions of the metal plates 41 through 45 exposed from the sealing resin 50 contribute discharging the heat generated by the IGBTs 10 and 20, and so forth. The metal plates 41 through 45 can be made from, for example, a lead frame. Note that if the metal plates 41 and 43 are made from a lead frame, the hanging lead terminals 41*b* and 43*b* are connected with a body (not shown) of the lead frame, and are portions cut off from the body of the lead frame after the body of the lead frame is sealed with the sealing resin 50.

Next, a method of manufacturing the semiconductor device according to the first embodiment will be described. FIGS. 8-12 illustrate manufacturing processes for the semiconductor device according to the first embodiment.

Figure 8:
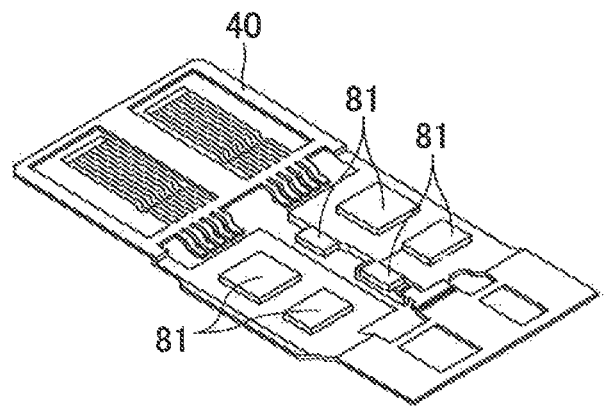
FIG. 8 illustrates a manufacturing process of the semiconductor device according to the first embodiment (No. 1)

First, in a process illustrated in FIG. 8, a lead frame 40 that has a predetermined shape is prepared through press work, for example. Then, the IGBTs 10 and 20 and the diodes 31 and 32 (not shown in FIG. 8, see FIGS. 3 and 4) are mounted on the lead frame 40 at predetermined positions via an electro-conductive bonding material such as tin-based solder (not shown).

Then, on the IGBT 10 and the diode 31, the electro-conductive spacer 61 (not shown in FIG. 8, see FIGS. 3 and 4) is mounted, and, on the IGBT 20 and the diode 32, the electro-conductive spacer 62 (not shown in FIG. 8, see FIGS. 3 and 4) is mounted. Further, the top face of the electro-conductive spacer 61, the top face of the electro-conductive spacer 62, the top face of the joint part 42*j* of a portion of the lead frame 40 to be the metal plate 42, and the top face of the joint part of a portion of the lead frame 40 to be the metal plate 43 are coated with an uncured electro-conductive bonding material 81 (for example, tin-based solder, or the like).

Figure 9:
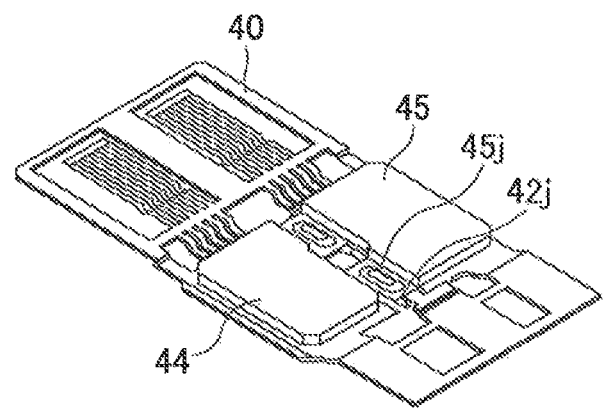
FIG. 9 illustrates a manufacturing process of the semiconductor device according to the first embodiment (No. 2)

Next, in a process illustrated in FIG. 9, after wire bonding is carried out, the metal plate 44 is mounted on the spacer 61 via the bonding material 81 (not shown). Also, on the spacer 62, the metal plate 45 is mounted via the bonding material 81 (not shown). Thereafter, a primer (such as a polyamide resin) is applied.

In this process, the top face of the joint part 42*j* of the portion of the lead frame 40 to be the metal plate 42 is joined with the bottom face the joint part 45*j* of the metal plate 45 via the electro-conductive bonding material 81 (see FIGS. 6 and 7). Also, the top face of the joint part of the portion of the lead frame 40 to be the metal plate 43 is joined with the bottom face of the joint part of the metal plate 44 via the electro-conductive bonding material 81.

Figure 10:
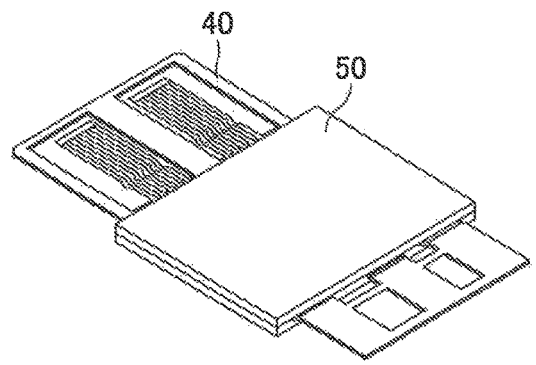
FIG. 10 illustrates a manufacturing process of the semiconductor device according to the first embodiment (No. 3)
Figure 11:
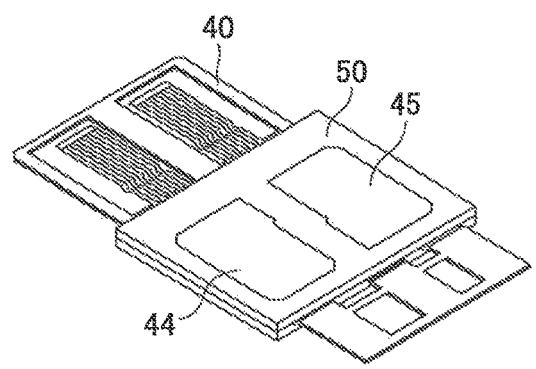
FIG. 11 illustrates a manufacturing process of the semiconductor device according to the first embodiment (No. 4)
Figure 12:
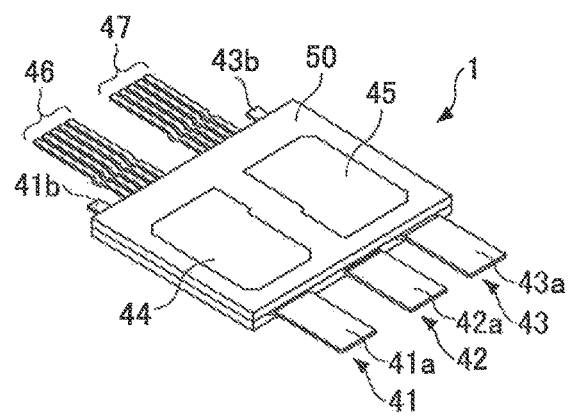
FIG. 12 illustrates a manufacturing process of the semiconductor device according to the first embodiment (No. 5)

Next, in a process illustrated in FIG. 10, molding is carried out, and the sealing resin 50 is formed. Next, in a process illustrated in FIG. 11, the top face of the sealing resin 50 cut off, and thus, the top faces of the metal plates 44 and 45 are exposed from the sealing resin 50. Next, in a process illustrated in FIG. 12, the lead frame 40 is cut at predetermined positions, and thus, the metal plates 41 through 43, the high-potential-side power supply terminal 41*a*, the low-potential-side power supply terminal 42*a*, the output terminal 43*a*, the hanging lead terminals 41*b* and 43*b*, and the control electrode terminals 46 and 47 are produced. Thus, the semiconductor device 1, illustrated in FIG. 2 and so forth, is completed.

Figure 13:
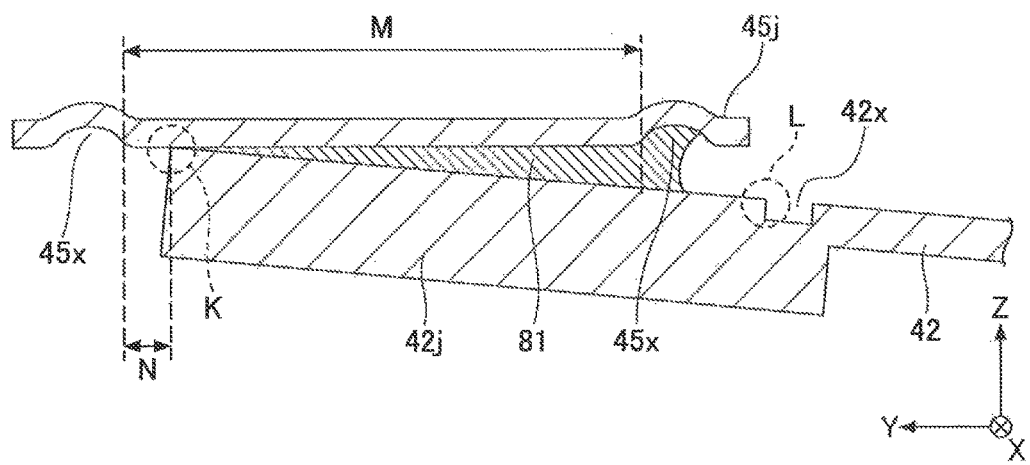
FIG. 13 illustrates a state where one of joint parts is inclined in a semiconductor device of a comparison example.

In the process illustrated in FIG. 9, there may be a case where the joint part 42*j* and the joint part 45*j* are not parallel, as illustrated in FIG. 13. This is because, as a result of the portion of the lead frame 40 to be the metal plate 42 has a cantilever structure (i.e., as a result of only one end being connected with the lead frame 40), a variation in the inclination of the joint part 42*j* is large.

If the upper portion of the front end K of the joint part 42*j* does not overlap with the groove 45*x* in plan view, an area N occurs where no portion of the bonding material 81 is present when, as illustrated in FIG. 13, the joint part 42*j* is inclined and comes into contact with the joint part 45*j*. As a result, it is not possible to join the joint part 42*j* with the joint part 45*j* throughout the joint area M. Also, almost none of the bonding material 81 is present, and no filet is formed, near the upper portion of the front end K (in FIG. 13, on the right side of the upper portion of the front end K).

As a result, it is difficult to firmly join the joint part 42*j* with the joint part 45*j*, and it is not possible to ensure the durability of a joining part (the bonding material 81 that joins the joint part 42*j* with the joint part 45*j*). For example, if a crack occurs in the bonding material 81, the crack starts from an end of the bonding material 81. Therefore, if almost none of the bonding material 81 is present near the upper portion of the front end K (in FIG. 13, on the right side of the upper portion of the front end K), a crack may be likely to occur there.

According to the present embodiment, in a zone where the bottom face of the joint part 45*j* faces the top face of the joint part 42*j*, a groove 45*x* that is a bonding-material-thickness ensuring means for ensuring the thickness of the bonding material 81 between the upper portion of the front end K of the joint part 42*j* and the bottom face of the joint part 45*j* is formed.

Figure 14:
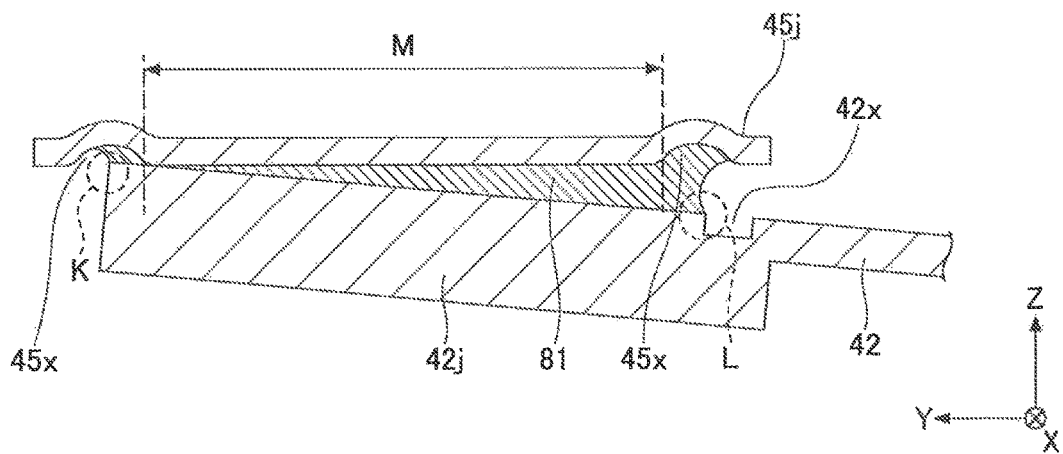
FIG. 14 illustrates a state where one of joint parts is inclined in the semiconductor device according to the first embodiment.

As a result of the upper portion of the front end K of the joint part 42*j* overlapping with the groove 45*x* in plan view, even if, as illustrated in FIG. 14, the joint part 42*j* is inclined and comes into contact with the joint part 45*j*, the upper portion of the front end K is joined with the joint part 45*j* in the groove 45*x*. Thereby, it is possible to join the joint part 42*j* with the joint part 45*j* throughout the joint area M. Also near the upper portion of the front end K, the bonding material 81 can be ensured to have a predetermined thickness. Also, a fillet is formed between the upper portion of the front end K and the inner wall of the groove 45x.

Also, because the upper portion of the rear end L of the joint part 42j overlaps with the groove 45x in plan view, the bonding material 81 can be ensured to have a predetermined thickness also near the upper portion of the rear end L. Also, a fillet is formed between the upper portion of the rear end L and the inner wall of the groove 45x.

As a result of these states, it is possible to firmly join the joint part 42j with the joint part 45j. For example, if the semiconductor device 1 is placed in a low-temperature environment and a high-temperature environment repetitiously, it is possible to reduce a likelihood of degradation (for example, an occurrence of a crack) in the joining part (the bonding material 81 that joins the joint part 42j with the joint part 45j). Thus, it is possible to improve the connection reliability between the joint part 42j and the joint part 45j.

Note that, in the structure according to the present embodiment, no problem occurs even if the bonding material 81 overflows the groove 45x. As can be seen from FIG. 4, the spacer 62 is present between the metal plate 45 and the diode 32, and the bonding material that joins the diode 32 to the metal plate 43 does not lie in the same plane as the bonding material 81. Therefore, even if the bonding material 81 overflows the groove 45x, the diode 32 is not affected. Because the metal plates 42 and 45 have the same electric potential as that of the spacer 62, even if the bonding material 81 adheres the spacer 62, no problem occurs.

<First Variant of First Embodiment>

A metal film that has wettability for the bonding material 81 better than that of the metal plate 42 may be formed on the bottom face of the joint part 45j including the inner wall of the groove 45x. For example, if the metal plate 42 is made of copper, a gold film having the wettability for the bonding material 81 better than that of copper can be used as the metal film. The gold film can be formed using, for example, a plating method. It is also possible to install a nickel film, a palladium film, or the like, under the gold film.

By thus forming the metal film that has wettability for the bonding material 81 better than that of the metal plate 42 on the bottom face of the joint part 45j including the inner wall of the groove 45x, the bonding material 81 more easily gathers into the groove 45x. Therefore, the bonding material 81 in the groove 45x is more likely to be ensured to have a predetermined thickness. As a result, the connection reliability between the joint part 42j and the joint part 45j can be further improved.

<Second Variant of First Embodiment>

Figure 15:
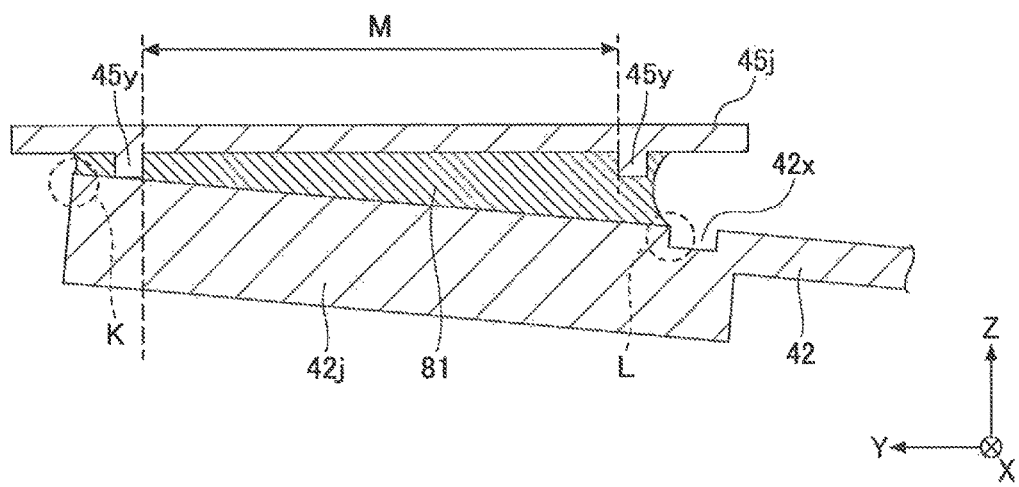
FIG. 15 illustrates a state where one of joint parts is inclined in a semiconductor device according to a second variant of the first embodiment.

FIG. 15 illustrates a state where one of joint parts is inclined in the semiconductor device according to a second variant of the first embodiment. According to the semiconductor device in the second variant of the first embodiment, a projection 45y is formed from the joint part 45j instead of the groove 45x. The projection 45y can be formed, for example, from the bottom face of the joint part 45j to have a ring shape.

The upper portion of the front end K of the joint part 42j is fixed via the bonding material 81 nearer the outer edge of the bottom face of the joint part 45j than the area where the projection 45y is formed in plan view. The width of the projection 45y can be, for example, on the order of 400 through 600 μm. The height of the projection 45y can be, for example, on the order of 200 through 300 μm.

Thus, according to the present embodiment, the projection 45y that is a bonding-material-thickness ensuring means for ensuring the thickness of the bonding material 81 between the upper portion of the front end K of the joint part 42j and the bottom face of the joint part 45j is formed in a zone where the bottom face of the joint part 45j faces the top face of the joint part 42j.

Because the upper portion of the front end K of the joint part 42j is placed nearer the outer edge of the bottom face of the joint part 45j than the area where the projection 45y is formed in plan view, the upper portion of the front end K is joined with the joint part 45j outside the projection 45y, even if, as shown in FIG. 15, the joint part 42j is inclined and comes into contact with the joint part 45j. Thereby, the joint part 42j can be joined with the joint part 45j throughout the joint area M. Also, near the upper portion of the front end K, the bonding material 81 can be ensured to have a predetermined thickness. Also, a fillet is formed between the upper portion of the front end K and the bottom face of the joint part 45j.

Also, because the upper portion of the rear end L of the joint part 42j is placed nearer the outer edge of the bottom face of the joint part 45j than an area where the projection 45y is formed in plan view, the bonding material 81 can be ensured to have a predetermined thickness also near the upper portion of the rear end L. Also, a fillet is formed between the upper portion of the rear end L and the bottom face of the joint part 45j.

Thereby, in addition to the advantageous effects of the first embodiment, the following advantageous effects are acquired. That is, even if the joint part 42j is approximately parallel to the joint part 45j, a space greater than or equal to the height of the projection 45y is ensured between the joint part 42j and the joint part 45j, and is filled with the bonding material 81. As a result, it is possible to cause the thickness of the bonding material 81 to be at any time greater than or equal to an approximately certain value.

Also, in the same manner as the first variant of the first embodiment, it is more suitable to form a metal film that has wettability for the bonding material 81 better than that of the metal plate 42 on the bottom face of the joint part 45j including the outer walls of the projection 45y. Note that, instead of forming the projection 45y from the bottom face of the joint part 45j of the metal plate 45, it is possible to acquire similar advantageous effects also by forming a projection from the top face of the joint part 42j of the metal plate 42.

<Third Variant of First Embodiment>

Figure 16:
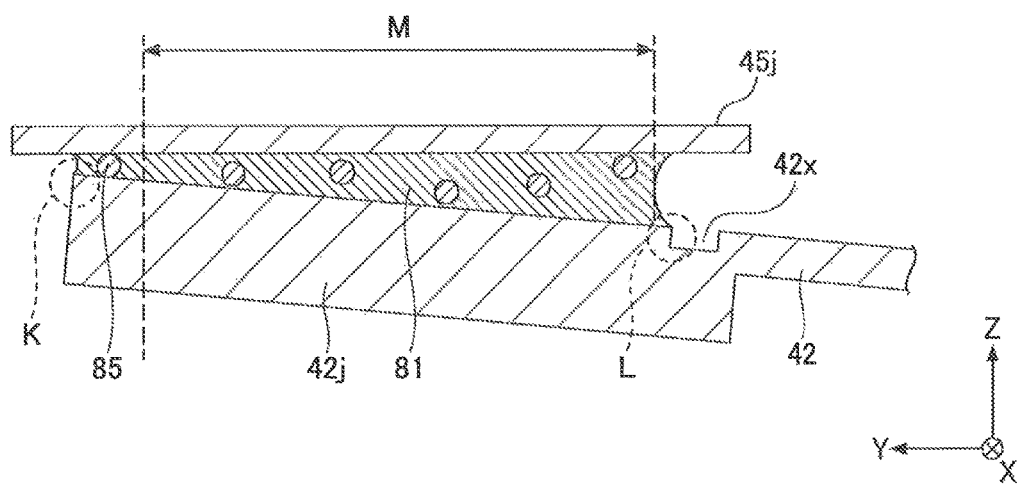
FIG. 16 illustrates a state where one of joint parts is inclined in a semiconductor device according to a third variant of the first embodiment.
Figure 17:
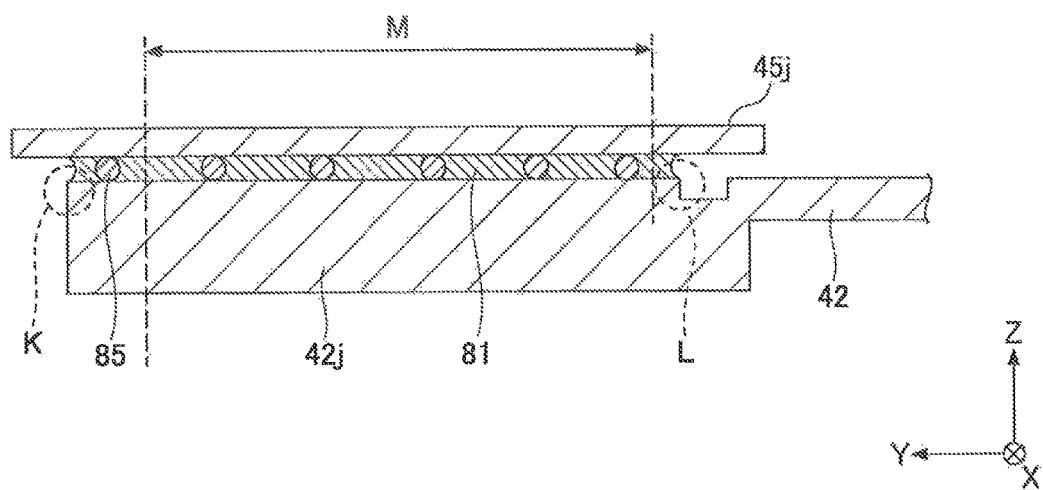
FIG. 17 illustrates a state where the one of the joint parts is not inclined in the semiconductor device according to the third variant of the first embodiment.

FIG. 16 illustrates a state where one of joint parts is inclined in the semiconductor device according to a third variant of the first embodiment. FIG. 17 illustrates a state where the one of the joint parts is not inclined in the semiconductor device according to the third variant of the first embodiment.

In the semiconductor device according to the third variant of the first embodiment, the bottom face of the joint part 45j is flat, and none of grooves and projections is formed there. Instead, the bonding material 81 contains many metal balls 85. In other words, in the bonding material 81, the many metal balls 85 are dispersed. As the metal balls 85, nickel balls each having, for example, a diameter on the order of 40 through 100 μm, or the like, can be used. However, the metal balls 85 need not be perfect spheres.

As a result of the bonding material 81 containing many metal balls 85, even if, as shown in FIG. 16, the joint part 42j is inclined, the joint part 42j does not come into contact with the joint part 45j, and a space on the order of the diameters of the metal balls 85 is ensured. The space is filled with the bonding material 81. Also, even if, as shown in FIG. 17, the joint part 42j is approximately parallel to the joint part 45j, the joint part 42j does not come into contact with the joint part 45j, and a space on the order of the diameters of the metal balls 85 is ensured. The space is filled with the bonding material 81.

That is, in any one of the cases of FIGS. 16 and 17, the metal balls 85 ensure a space between the upper portion of the front end K of the joint part 42j and the bottom face of the joint part 45j, and the space is filled with the bonding material 81. Also, the metal balls 85 ensure a space between the upper portion of the rear end L of the joint part 42j and the bottom face of the joint part 45j, and the space is filled with the bonding material 81. Also, a fillet is formed between the upper portion of the front end K of the joint part 42j and the bottom face of the joint part 45, and between the upper portion of the rear end L of the joint part 42j and the bottom face of the joint part 45j.

Thus, according to the present embodiment, in a zone where the bottom face of the joint part 45j faces the top face of the joint part 42j, metal balls 85 (that are present in a state of being dispersed in the bonding material 81) that are a bonding-material-thickness ensuring means for ensuring the thickness of the bonding material 81 between the upper portion of the front end K of the joint part 42j and the bottom face of the joint part 45j are provided.

Thereby, in addition to the advantageous effects of the first embodiment, the following advantageous effects are acquired. That is, even if the joint part 42j is approximately parallel to the joint part 45j, it is possible to cause the thickness of the bonding material 81 to be at any time greater than or equal to an approximately certain value, because a space greater than or equal to the diameters of the metal balls 85 is ensured between the joint part 42j and the joint part 45j, and the space is filled with the bonding material 81. Also, wettability of the bonding material 81 is satisfactory around the metal balls 35. Thereby, it is possible to further improve connection reliability between the joint part 42j and the joint part 45j.

Also, in the same way as that of the first variant of the first embodiment, it is more suitable to form a metal film that has wettability for the bonding material 81 better than the metal plate 42 on the bottom face of the joint part 45j.

Thus, the preferred embodiment and the variants thereof have been described in detail. However, embodiments are not limited to the above-described embodiment and the variants thereof, and various changes and replacements can be made on the above-described embodiment and the variants thereof, without departing from the claimed scope.

For example, for the above-mentioned embodiment, the semiconductor device where the plurality of semiconductor elements (IGBTs and the diode) are arranged longitudinally and laterally has been illustrated. However, the present invention may be applied to, for example, a semiconductor device where two semiconductor elements into each of which an IGBT and a diode are integrated are arranged, or the like. Further, it is also possible to apply the present invention to, for example, a semiconductor device that has a single semiconductor element into which a IGBT and a diode are integrated.

Also, the above-described embodiment and variants thereof may be appropriately combined.

The present international application is based on and claims the benefit of the priority of Japanese patent application No. 2014-046595, dated Mar. 10, 2014, and the entire contents of Japanese patent application No. 2014-046595 are hereby incorporated herein by reference.

DESCRIPTION OF REFERENCE SIGNS 1 a semiconductor device
10, 20 IGBTs
11, 21 collector electrodes
12, 22 emitter electrodes
13, 23 gate electrodes
31, 32 diodes
40 a lead frame
41a a high-potential-side power supply terminal
41b, 43b hanging lead terminals
41, 42, 43, 44, 45 metal plates
42a a low-potential-side power supply terminal
42j, 45j joint parts
42x, 45x grooves
43a an output terminal
45y a projection
46, 47 control electrode terminals
50 a sealing resin
61, 62 spacer
81 a bonding material
85 a metal ball

The invention claimed is:
1. A semiconductor device comprising:
a first semiconductor element;
a second semiconductor element;
a first plate-like part that is made of an electric conductor, is electrically connected to a top-face-side electrode of the first semiconductor element, and includes a first joint part that projects from a side face of the first plate-like part;
a second plate-like part that is made of an electric conductor, and includes a second joint part that projects from a side face of the second plate-like part;
a third plate-like part that is made of an electric conductor, is electrically connected to a top-face-side electrode of the second semiconductor element, and includes a third joint part that projects from a side face of the third plate-like part; and
a fourth plate-like part that is made of an electric conductor, and includes a fourth joint part that projects from a side face of the fourth plate-like part,
wherein
a bottom face of the first joint part and a top face of the second joint part face one another, and are electrically connected via a first electro-conductive bonding material,
a bonding-material-thickness ensuring part is provided in a zone where the bottom face of the first joint part and the top face of the second joint part face one another to ensure a thickness of the first electro-conductive bonding material between an upper portion of a front end of the second joint part and the bottom face of the first joint part, and
the third joint part and the fourth joint part are directly electrically connected via a second electro-conductive bonding material.
2. The semiconductor device as claimed in claim 1, wherein
the bonding-material-thickness ensuring part is a groove formed from the bottom face of the first joint part, and the upper portion of the front end of the second joint part is fixed via the first electro-conductive bonding material at a position overlapping with the groove in plan view.
3. The semiconductor device as claimed in claim 1, wherein
the bonding-material-thickness ensuring part is a projection formed from the bottom face of the first joint part, and the upper portion of the front end of the second joint part is fixed via the first electro-conductive bonding material nearer an outer edge of the bottom face of the first joint part than the projection.

4. The semiconductor device as claimed in claim 1, wherein
the bonding-material-thickness ensuring part is a metal ball contained in the first electro-conductive bonding material, and
the metal ball ensures a space between the upper portion of the front end of the second joint part and the bottom face of the first joint part, and the space is filled with the first electro-conductive bonding material.

5. The semiconductor device as claimed in claim 2, wherein
the groove is formed to have a ring shape.

6. The semiconductor device as claimed in claim 1, wherein
a metal block is placed between a bottom face of the first plate-like part and the top-face-side electrode of the first semiconductor element.

7. The semiconductor device as claimed in claim 1, wherein
the bonding-material-thickness ensuring part includes a groove having a semicircular sectional shape.

8. The semiconductor device as claimed in claim 1, wherein
the bonding-material-thickness ensuring part is a first bonding-material-thickness ensuring part,
a bottom face of the third joint part and a top face of the fourth joint part face one another, and are electrically connected via the second electro-conductive bonding material, and
a second bonding-material-thickness ensuring part is provided in a zone where the bottom face of the third joint part and the top face of the fourth joint part face one another to ensure a thickness of the second electro-conductive bonding material between an upper portion of a front end of the fourth joint part and the bottom face of the third joint part.

9. The semiconductor device as claimed in claim 1, wherein
the second plate-like part has a low-potential-side power supply terminal of the semiconductor device, and
the fourth plate-like part has an output terminal of the semiconductor device.

10. The semiconductor device as claimed in claim 1, wherein
the first joint part projects from the side face of the first plate-like part in a first direction, and
the second joint part projects from the side face of the second plate-like part in a second direction perpendicular to the first direction.

11. A semiconductor device comprising:
a semiconductor element;
a first plate-like part that is made of an electric conductor, is electrically connected to a top-face-side electrode of the semiconductor element, and includes a first joint part that projects from a side face of the first plate-like part; and
a second plate-like part that is made of an electric conductor, and includes a second joint part that projects from a side face of the second plate-like part,
wherein
a bottom face of the first joint part and a top face of the second joint part face one another, and are electrically connected via an electro-conductive bonding material,
a bonding-material-thickness ensuring part is provided in a zone where the bottom face of the first joint part and the top face of the second joint part face one another to ensure a thickness of the electro-conductive bonding material between an upper portion of a front end of the second joint part and the bottom face of the first joint part,
the bonding-material-thickness ensuring part is a groove formed from the bottom face of the first joint part,
the upper portion of the front end of the second joint part is fixed via the bonding material at a position overlapping with the groove in plan view,
the groove is formed to have a ring shape,
a top face of the second joint part is a projection, and
an upper portion of a front end of the projection and an upper portion of a rear end of the projection are fixed via the bonding material at positions overlapping with the groove in plan view.

12. A semiconductor device comprising:
a first semiconductor element;
a second semiconductor element;
a first plate-like part that is made of an electric conductor, is electrically connected to a top-face-side electrode of the first semiconductor element, and includes a first joint part that projects from a side face of the first plate-like part;
a second plate-like part that is made of an electric conductor, and includes a second joint part that projects from a side face of the second plate-like part;
a third plate-like part that is made of an electric conductor, is electrically connected to a top-face-side electrode of the second semiconductor element, and includes a third joint part that projects from a side face of the third plate-like part; and
a fourth plate-like part that is made of an electric conductor, and includes a fourth joint part that projects from a side face of the fourth plate-like part,
wherein
a bottom face of the first joint part and a top face of the second joint part face one another, and are electrically connected via an electro-conductive bonding material,
a bonding-material-thickness ensuring part is provided in a zone where the bottom face of the first joint part and the top face of the second joint part face one another to ensure a thickness of the electro-conductive bonding material between an upper portion of a front end of the second joint part and the bottom face of the first joint part, and
the second plate-like part is not electrically connected to a bottom-face-side electrode of the second semiconductor element.

* * * * *